United States Patent
Zhu et al.

(10) Patent No.: US 11,615,826 B1
(45) Date of Patent: Mar. 28, 2023

(54) DUAL-ADDRESS COMMAND MANAGEMENT USING CONTENT ADDRESSABLE MEMORY

(71) Applicant: Micron Technology, Inc., Boise, ID (US)

(72) Inventors: Fangfang Zhu, San Jose, CA (US); Chih-Kuo Kao, Fremont, CA (US); Yueh-Hung Chen, Sunnyvale, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 17/468,044

(22) Filed: Sep. 7, 2021

(51) Int. Cl.
*G11C 15/04* (2006.01)
*G11C 8/06* (2006.01)
*G11C 8/18* (2006.01)

(52) U.S. Cl.
CPC .................. *G11C 8/06* (2013.01); *G11C 8/18* (2013.01); *G11C 15/04* (2013.01)

(58) Field of Classification Search
CPC .............. G11C 15/04; G11C 8/06; G11C 8/18

USPC ....................................................... 365/230.08
See application file for complete search history.

(56) References Cited

U.S. PATENT DOCUMENTS 6,973,550 B2 * 12/2005 Rosenbluth ......... G06F 13/1642
711/156

* cited by examiner

*Primary Examiner* — Son L Mai
(74) *Attorney, Agent, or Firm* — Lowenstein Sandler LLP

(57) ABSTRACT

A memory system includes a memory device and a processing device operatively coupled with the memory device. The processing device perform operations comprising: responsive to receiving a memory access command, determining that the memory access command is a dual-address command comprising a source address and a destination address; generating a first content addressable memory (CAM) entry associated with a read command of the dual-address command, wherein the first CAM entry references the source address; generating a second CAM entry associated with a write command of the dual-address command, wherein the second CAM entry references the destination address; inserting the first CAM entry and the second CAM entry into a CAM; and issuing, to the memory device, the read command associated with the first CAM entry.

20 Claims, 6 Drawing Sheets

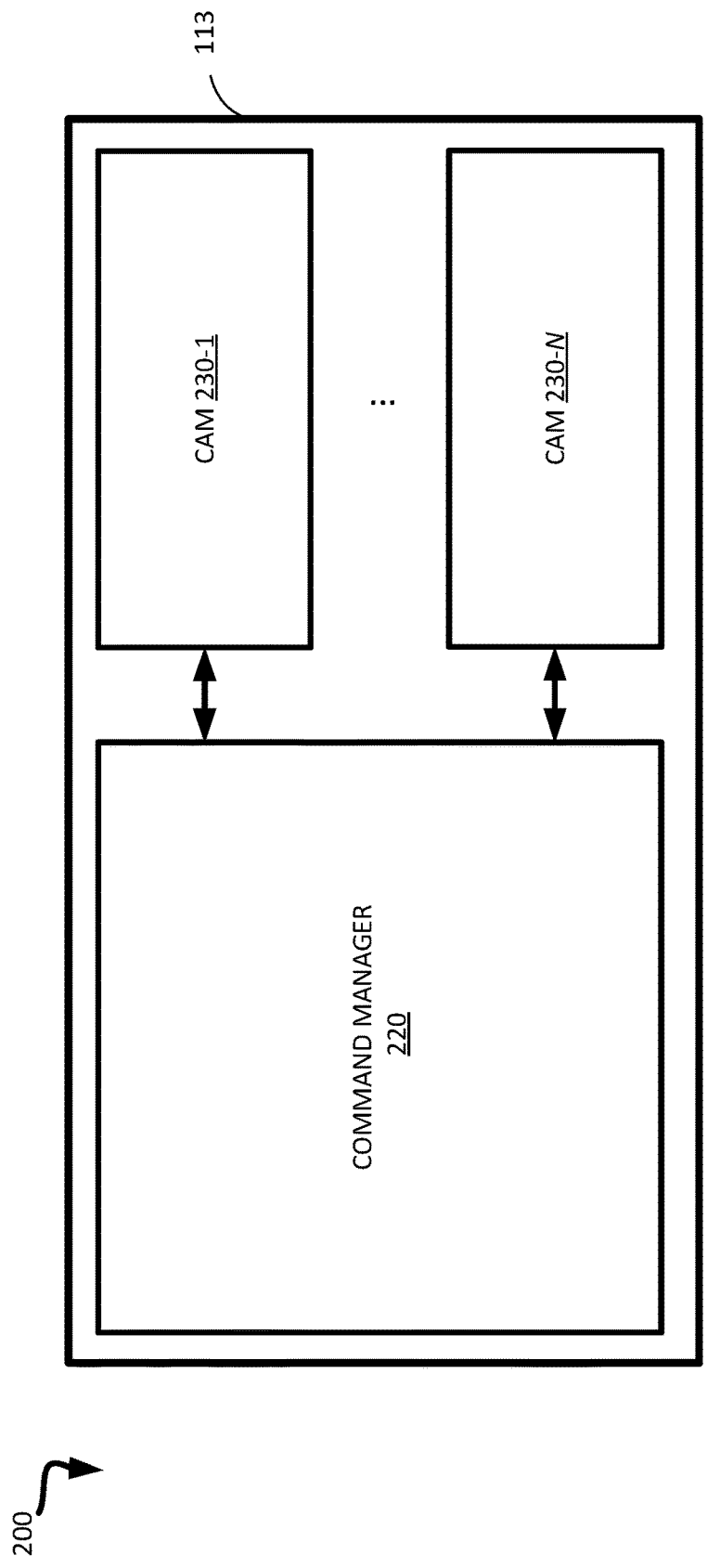
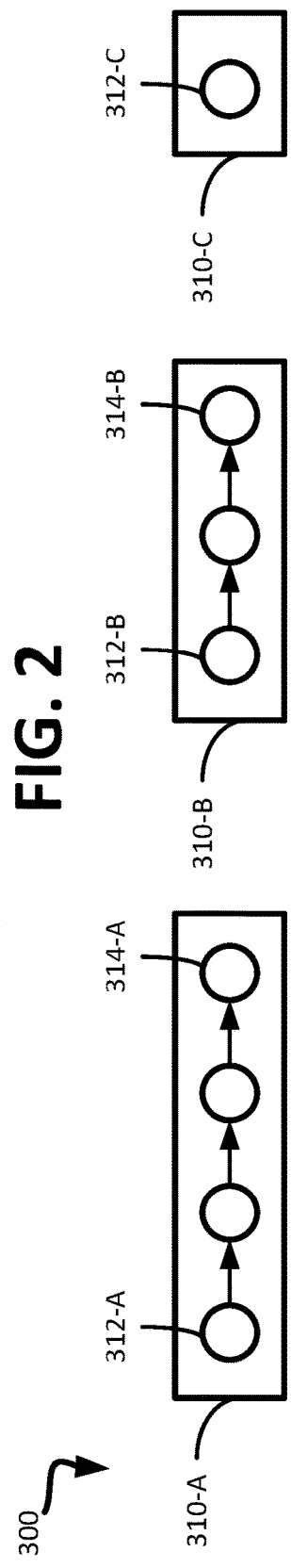

METADATA TABLE 405

| CAM FIELD | VALUE |
|---|---|
| CAM ENTRY VALUE | INTERGER |
| VALID | 1 or 0 |
| COMMAND TYPE | SINGLE ADDRESS or DUAL ADDRESS |
| HEAD | 1 or 0 |
| ADDRESS | PBA or LBA |
| TAIL | 1 or 0 |
| NEXT | INTERGER |
| DST HEAD | 1 or 0 |
| DST PBA | PBA or LBA |
| MOVE READ | 1 or 0 |
| MOVE WRITE | 1 or 0 |
| HOLDTAG | INTERGER |

FIG. 4

DUAL-ADDRESS COMMAND MANAGEMENT USING CONTENT ADDRESSABLE MEMORY

TECHNICAL FIELD

Embodiments of the disclosure relate generally to memory sub-systems, and more specifically, relate to dual-address command management using content addressable memory (CAM) in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2 is a block diagram of an example system including a memory access command management (DCM) component, in accordance with some embodiments of the present disclosure.

FIG. 3 is a diagram illustrating examples of queues of memory access commands, in accordance with some embodiments of the present disclosure.

FIG. 4 is a block diagram of a content addressable memory (CAM) metadata, in accordance with some embodiments of the present disclosure.

DETAILED DESCRIPTION

Figure 1:
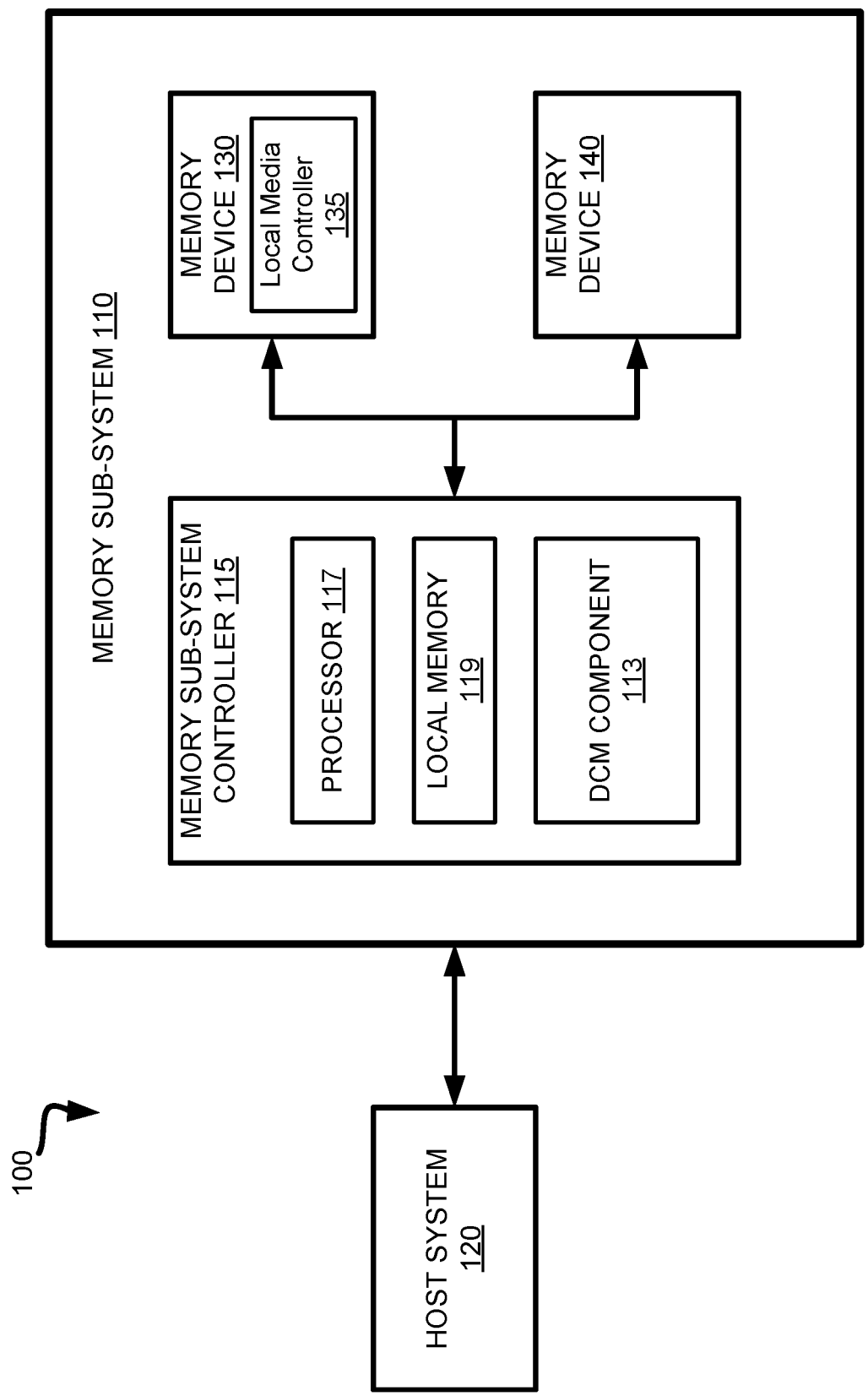
FIG. 1 illustrates an example computing system that includes a memory sub-system in accordance with some embodiments of the present disclosure.

Aspects of the present disclosure are directed relate to dual-address command management using content addressable memory (CAM) in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

Memory access commands request the memory device to perform memory access operations. Memory access commands can generally be classified into respective categories, such as read commands, write commands, erase commands, move commands, etc. A memory sub-system controller can assign received memory access commands to one of multiple queues in the memory sub-system. Illustratively, a queue can be in the form of a linked list including a head and a tail, where memory access commands are retrieved from the queue and executed in a first-in, first-out (FIFO) manner. Since a memory access command from only one of the queues may be executed at a time, the memory sub-system controller can use a sequencer to service commands identified within the queues according to a scheduling scheme.

A memory access command can designate an address identifying a memory location (e.g., a management unit) on the memory device. For example, the address can be a physical block address (PBA). A media controller architecture (e.g., 3D cross-point media controller architecture) can include a command management component and a set of communication channels ("channels") that enables multi-channel communication between the media controller architecture and the memory device. The command management component can handle data integrity and command order based on time of entry (e.g., a FIFO command execution scheme). Each channel of the set of channels can implement a content-addressable memory (CAM) to receive commands for a particular memory location on the memory device, and place the commands into a queue maintained on the CAM (e.g., for a FIFO command execution scheme, append a new memory access command to the tail of the queue). Thus, each CAM can be used to ensure that memory access commands of a particular memory location are processed in order within the corresponding channel.

A CAM is a type of memory device that is often used in certain very high speed searching applications such as identifier (ID) and pattern matching. Generally, a CAM is searched by comparing input search data against a table of stored data entries and a memory address of matching data in the table is returned. CAMs are frequently implemented in dynamic random-access memory (DRAM), or synchronous random-access memory (SRAM). Both DRAM and SRAM, however, have a limited memory capacity, which limits the amount of data that can be stored and searched in conventional CAM implementations.

A move command is a memory access command that includes two addresses; a source address and a destination address. In particular, a move command can be used to move data from one address to another address. For example, a move command can perform a read access command instructing the memory device to perform a read access operation on the source address, and a write access command instructing the memory device to write (program), to the destination address, the data read from the source address. A move command can be used, for example, in wear-leveling operations to prevent one portion of the memory device from being overused and experiencing premature failure.

In some memory sub-systems, the memory sub-system controller inserts separate commands to the CAM to process a move command. In particular, the memory sub-system controller can insert a read command into the CAM, store the retrieved data in a cache, and then insert a write command into the CAM to program, onto the memory device, the retrieved data. However, this process is relatively time consuming, which increases the memory sub-system system latency and decreases performance.

Aspects of the present disclosure address the above and other deficiencies by providing content addressable memory (CAM) capable of executing a move command. In some embodiments, a memory sub-system can utilize a CAM architecture implemented in a NAND-type flash memory device to provide both fast and high capacity search capability. Consistent with this architecture, a memory sub-system controller can employ one or more CAMs, where each CAM maintains a queue storing identifiers for memory access operations at a particular memory location (e.g., PBA) residing on a memory device. In some embodiments, the queue can be implemented by a linked list identifying the sequence of memory access commands designating the particular memory location. The queue can have a head command corresponding to the least recent memory access command received by the CAM for the particular memory location, and the tail corresponding to the most recent memory access command to be received by the CAM for the particular memory location. Each memory access command inserted into a CAM can be referred to as a CAM entry. Each CAM entry can include metadata indicative of different parameters and characteristics of the memory access command. In some embodiments, the metadata can include a "command type" identifier to indicate the command type of the CAM entry (e.g., single address command or dual-address command), an "address" identifier to identify the physical block address (PBA) (and/or the logical block address (LBA)) referenced by the memory access command, a "destination address" identifier to indicate the destination address of a move command, a "destination head" identifier to indicate that the CAM entry is the head in a linked list for a move command destination address, a "move read" identifier to indicate that the CAM entry is the read command part of a move command, a "move write" identifier to indicate that the CAM entry is the write command part of a move command, and a "holdtag" identifier to indicate, in the read command part of a move command, which CAM entry is the write command part of a move command. For example, the holdtag can indicate in the CAM entry metadata of a read command part of a move command, that CAM entry 5 is the corresponding write part of the move command.

When a CAM has a free entry, the memory sub-system controller can select a memory access command (from a queue or cache) to insert into the CAM. To perform the insertion, the memory sub-system controller can first determine whether the memory access command is a single address command (e.g., write command, read command, erase command) or a dual-address command (e.g., a move command). If the memory access command is a dual-address command, the memory sub-system controller can generate two CAM entries; a CAM entry for the read command part of the move command, and a CAM entry for the write command part of the move command. The memory sub-system controller can further search the metadata of each valid CAM entry to determine the PBA and/or the LBA referenced by each correlating memory access command. Responsive to the memory sub-system controller determining that both the source address referenced by the read command part of the move command and the destination address referenced by the write command part of the move command match addresses referenced by two or more pending CAM entries, the memory sub-system controller can append the read command part to the tail of the queue referencing the same address as the read command part, and append the write command part to the tail of the queue referencing the same address as the write command part. The memory sub-system controller can further indicate, via the metadata, the corresponding parameters of both CAM entries (e.g., whether the CAM entry is a read command part of the move command or a write command part of the move command, which CAM entry is the write command part of a move command, etc.). Responsive to determining that the source address referenced by the move command matches an address referenced by one or more of the CAM entries, but not the destination address referenced by the move command, the memory sub-system controller can append the read command part to the tail of the queue referencing the same address as the read command part, and insert the write command part as a head memory access command. The memory sub-system controller can further indicate, via the metadata, the corresponding parameters of both CAM entries. Responsive to determining that the destination address referenced by the move command matches an address referenced by one or more of the CAM entries, but not the source address referenced by the move command, the memory sub-system controller can append the write command part to the tail of the queue referencing the same address as the read command part, and insert the read command part as a head memory access command. The memory sub-system controller can further indicate, via the metadata, the corresponding parameters of both CAM entries. Responsive to determining that the source address and the destination address referenced by the move command do not match any of the addresses referenced by the CAM entries, the memory sub-system controller can insert each of the read command part and the write command part as a head memory access command. The memory sub-system controller can further indicate, via the metadata, the corresponding parameters of both CAM entries.

Advantages of the present disclosure include, but are not limited to, improved performance in the memory sub-system. In particular, the present disclosure enables the memory sub-system to maintain memory access command ordering for both single address memory access commands, and dual-address memory access commands. Thus, the present disclosure improves memory access command latency and quality of service (QoS), data transaction synchronization, and reduces hardware implementation complexity. In addition, less memory sub-system controller resources are utilized to implement the functionality of the present disclosure, which can reduce cost and power utilization in the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a data consistency management (DCM) component 113. In some embodiments, the memory sub-system controller 115 includes at least a portion of the DCM component 113. In some embodiments, the DCM component 113 is part of the host system 110, an application, or an operating system. In other embodiments, local media controller 135 includes at least a portion of DCM component 113 and is configured to perform the functionality described herein.

In some embodiments, the DCM component 113 can enforce data consistency for a memory device to prevent out-of-sync situations from occurring by controlling how incoming memory access commands are serviced. To do so, the DCM component 113 can manage an incoming memory access command based on whether the memory access command is a single address command (e.g., write command, read command, erase command) or a dual-address command (e.g., a move command). If the incoming memory access command is a dual-address command, the DCM component 113 can insert two memory access commands (a write command and a read command) into a CAM, and perform a set of operations to prevent the write command and/or the read command from being processed out-of-sync with other pending memory access commands. Further details regarding the DCM component 113 will now be described below with reference to FIG. 2.

FIG. 2 is a block diagram of example system 200 including data consistency management (DCM) component 113, in accordance with some embodiments of the present disclosure. The DCM component 113 can be included within a memory sub-system controller, such as memory sub-system controller 115. The DCM component 113 can be included in any suitable memory sub-system in accordance with the embodiments described herein. For example, the DCM component 113 can be included within a memory sub-system corresponding to a 3DXP memory device (e.g., the memory device 130 of FIG. 1).

As shown, the DCM component 113 can include a command manager 220, and a number of CAMs 230-1 through 230-N. The command manager 220 can issue commands for processing by the CAMs 230-1 through 230-N to handle data integrity and command order (e.g., a FIFO command execution scheme). For example, a memory access command issued by command manager 220 is routed to one of the CAMs 230-1 through 230-N based on the memory location designated by the memory access command. Each of the CAMS 230-1 through 230-N can store multiple command entries identified by a corresponding CAM entry value. Each of the CAMS 230-1 through 230-N can maintain a queue of memory access commands that have been issued by the command manager 220, where each queue includes memory access commands that correspond to a particular memory location (e.g., PBA). In some embodiments, each queue of memory access commands includes a linked list of temporally ordered memory access commands. Thus, the queue can be used to process memory access commands for a particular memory location in temporal order (e.g., FIFO order). Examples of linked lists of memory access operations are described below with reference to FIG. 3, and further details regarding the processes that can be performed by the DCM component 113 to implement data consistency management will be described below with reference to FIGS. 5 and 6.

FIG. 3 is a diagram 300 illustrating examples of queues of memory access operations commands, in accordance with some embodiments of the present disclosure. The diagram 300 shows a first queue 310-A corresponding to a first memory location residing on a memory device (e.g., physical block address (PBA)), a second queue 310-B corresponding to a second memory location residing on the memory device, and a third queue 310-C corresponding to a third memory location residing on the memory device. The first queue 310-A includes four memory access commands, including the head memory access command 312-A and the tail memory access command 314-A. The second queue 310-B includes three memory access commands, including a head memory access command 312-B and a tail memory access command 312-B. The third queue 310-C includes a memory access command 312-C, which can be both a head memory access command and a tail memory access command.

In some embodiments, each of the queues 310-A through 310-C is in the form of a linked list. An incoming memory access command can be appended to the tail of the linked list (e.g., FIFO order). For example, the head memory access commands 312-A through 312-C can correspond to the least recent memory access commands remaining in their respective queues 310-A through 310-C, and the tail memory access commands 314-A through 314-C can correspond to the oldest memory access commands remaining in their respective queues 310-A through 310-C. After one of the head memory access commands 312-A through 312-C is completed, the head memory access command is deleted from its corresponding queue, and any next memory access command linked to the head memory access command becomes the new head memory access command (if one exists). If a next memory access command linked to the head memory access command does not exist, such as that shown in queue 310-C with respect to the single memory access command 312-C, then no additional memory access commands are performed with respect to the corresponding memory location until a new memory access command at the memory location.

FIG. 4 is a diagram 400 illustrating example metadata correlating to each memory access command inserted into a CAM (e.g., to each CAM entry), in accordance with some embodiments of the present disclosure. FIG. 4 illustrates an example metadata table 405 that include a set of CAM fields 410, and corresponding values 420. Each CAM entry can include a set of metadata identifying different parameters and/or characteristics of correlating memory access command. In some embodiments, the metadata can include a CAM entry value. The CAM entry value can be used, by the DCM component 113, as a CAM entry identifier. In some embodiments the metadata can include a "valid" identifier to indicate whether the CAM entry is valid (e.g., whether the CAM entry has been processed by the memory device). For example, DCM component 113 can use a binary value of 1 to indicate that a memory access command is valid, and a binary value of 0 to indicate that the memory access command is not valid. In some embodiments, the metadata can include a "command type" identifier to indicate the command type of the CAM entry (e.g., single address command or dual-address command). In some embodiments, the metadata can include a "head" identifier to indicate whether the CAM entry is a head memory access command. For example, DCM component 113 can use a binary value of 1 to indicate that a memory access command is a head memory access command, and a binary value of 0 to indicate that the memory access command is not a head memory access command. In some embodiments, the metadata can include a "tail" identifier to indicate whether the CAM entry is tail memory access command. For example, DCM component 113 can use a binary value of 1 to indicate that a memory access command is a tail memory access command, and a binary value of 0 to indicate that the memory access command is not a tail memory access command). In some embodiments, the metadata can include an "address" identifier to identify the physical block address (PBA) (and/or the logical block address (LBA)) referenced by the memory access command. A move command can be referenced as two separate CAM entries (e.g., a read command part referencing a source address and a write command part referencing a destination address). In some embodiments, the address identifier can correlate to the source address referenced by the read command part of the move command, and the address identifier can correlate to the destination address referenced by the write command part of the move command. In some embodiments, the metadata can include a "next" identifier to indicate which CAM entry is a subsequent entry in the corresponding linked list. For example, a queue can includes 2 memory access commands, including a head memory access command as CAM entry 2, and a tail memory access command as CAM entry 5. The DCM component 113 can set the next indicator of the metadata of CAM entry 2 to identify CAM entry 5 as the subsequent memory access command of the linked list.

In some embodiments, the metadata can include a "destination head" identifier to indicate that the CAM entry is the head in a linked list for a move command destination address. In some embodiments, the metadata can include a "destination address" identifier to indicate the destination address of a move command. In some embodiments, the metadata can include a "move read" identifier to indicate that the CAM entry is the read command part of a move command. In some embodiments, the metadata can include a "move write" identifier to indicate that the CAM entry is the write command part of a move command. In some embodiments, the metadata can include a "holdtag" identifier to indicate, in the read command part of a move command, which CAM entry is the write command part of a move command. For example, the holdtag can indicate, in the CAM entry metadata of a read command part, that CAM entry 6 is the corresponding write part.

Figure 5:
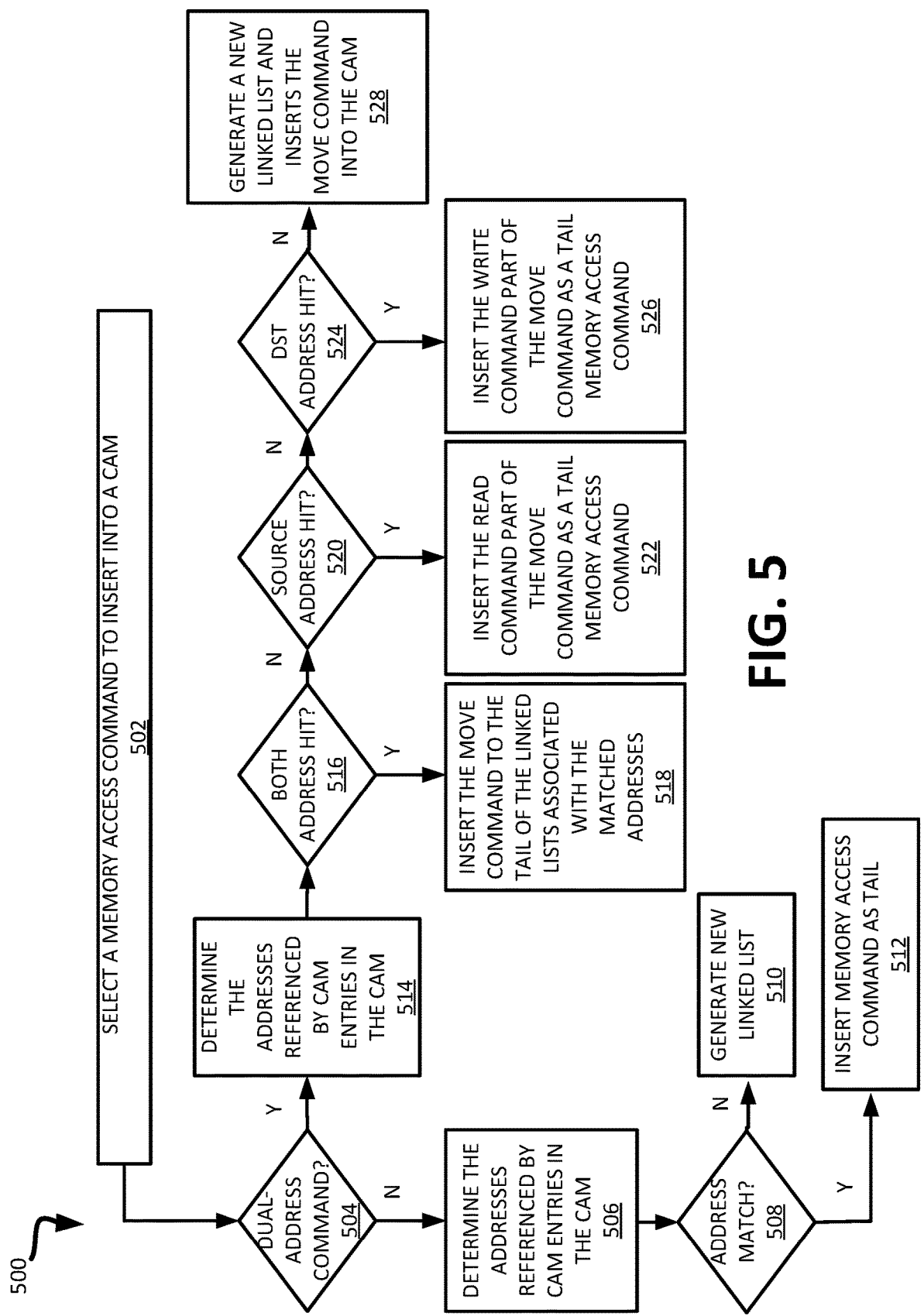
FIG. 5 is a flow diagram is a flow diagram of an example method of implementing data consistency management, in accordance with some embodiments of the present disclosure.

FIG. 5 is a flow diagram of an example method 500 of implementing data consistency management, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the DCM component 113 of FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 502, the processing logic can select a memory access command to insert into a CAM (e.g., CAM 230-1 through 230-N). For example, responsive to the CAM having a free entry, the processing logic can select a memory access command, from a queue or cache, based on at least one of the priority of the memory access command (e.g., host initiated command or controller initiated command), a position received by the queue or cache (e.g., FIFO, LIFO (last-in, first-out), etc.), or any other means. The memory access command can designate a memory location residing on a memory device. The memory location can be associated with any suitable memory device. In some embodiments, the memory location is a PBA.

At operation 504, the processing logic determines whether the memory access command is a single address command (e.g., write command, read command, erase command) or a dual-address command (e.g., a move command). Responsive to the memory access command being a single address command, the processing logic proceeds to operation 506. Responsive to the memory access command being a dual-address command, the processing logic proceeds to operation 514.

At operation 506, the processing logic determines the addresses referenced by CAM entries in the CAM. In some embodiments, the processing logic can search the metadata correlating to each CAM entry to determine the PBA (and/or the LBA) referenced by each memory access command. In some embodiments, the processing logic can search only the CAM entries that are valid (e.g., include a "valid" identifier set to a binary value of 1).

At operation 508, the processing logic determines whether any of the CAM entries match the address referenced by the memory access command. For example, the processing logic can determine whether the PBA referenced by the memory access command is the same as the PBA referenced by any of the CAM entries. Responsive to the processing logic determining that none of the CAM entries reference the same address as the memory access command, the processing logic proceeds to operation 510. Responsive to the processing logic determining that one or more of the CAM entries reference the same address as the memory access command, the processing logic proceeds to operation 512.

At operation 510, the processing logic generates a new linked list and inserts the memory access command into the CAM. For example, the processing logic can set the head identifier and the destination head identifier (of the metadata correlating to the CAM entry of the inserted memory access command) to a value of 1 to indicate that the memory access command is a head memory access command. The processing logic can then issue the memory access command.

At operation 512, the processing logic can insert the memory access command as a tail memory access command of a linked list associated with the matched address. For example, the processing logic can set the head identifier to a binary value of 0 and the destination head identifier to a binary value of 1.

At operation 514, the processing logic determines the addresses referenced by the CAM entries in the CAM. In some embodiments, the processing logic can search the metadata correlating to each memory access command inserted into the CAM to determine the PBA (and/or the LBA) referenced by each memory access command. In some embodiments, the processing logic can search only the CAM entries that are valid.

At operation 516, the processing logic determines whether both the source address and the destination address referenced by the dual-address command (e.g., the move command) are the same as addresses referenced by two or more of the CAM entries. Responsive to determining that both the source address and the destination address referenced by the memory access command are the same as addresses referenced by two or more of the CAM entries in the CAM, the processing logic proceeds to operation 518 and inserts the move command to the tail of the linked lists associated with the matched addresses. For example, the processing logic can insert a read command part of the move command as a tail memory access command to the linked list referencing the source address of the move command, and insert a write command part of the move command as a tail memory access command to the linked list referencing the destination address of the move command. The processing logic can set the head identifier to a binary value of 0 and the destination head identifier to a binary value of 0 for both parts of the move command.

Responsive to determining that both the source address and the destination address referenced by the move command are not the same (e.g., do not match) as the addresses referenced by two or more of the CAM entries, the processing logic proceeds to operation 520.

At operation 520 the processing logic determines whether the source address referenced by the move command matches the address referenced by one or more of the CAM entries. Responsive to determining that the source address referenced by the move command matches the address referenced by one or more of the CAM entries (and the destination address of the move command does not match the addresses referenced by one or more of the CAM entries), the processing logic proceeds to operation 522 and inserts the read command part of the move command as a tail memory access command to the linked list referencing the source address of the move command, and insert a write command part of the move command as a head memory access command. For the read command part of the move command, the processing logic can set the head identifier to a binary value of 0 and the destination head identifier to a binary value of 1. The processing logic can then insert the write command part of the move command into CAM as another CAM entry, and set the holdtag identifier to a binary value of 1 to indicate that the CAM entry correlating to the write command part of the move command is linked to the CAM entry correlating to the read command part of the move command.

Responsive to determining that the source address referenced by the move command does not match the address referenced by one or more of the CAM entries, the processing logic proceeds to operation 524.

At operation 524 the processing logic determines whether the destination address referenced by the move command matches the address referenced by one or more of the CAM entries. Responsive to determining that the destination address referenced by the move command matches the address referenced by one or more of the CAM entries (and the source address of the move command does not match the addresses referenced by one or more of the CAM entries), the processing logic proceeds to operation 526 and inserts the write command part of the move command as a tail memory access command to the linked list referencing the destination address of the memory access command, and inserts the read command part of the move command as a head memory access command. For the read command part of the move command, the processing logic can set the head identifier to a binary value of 1 and the destination head identifier to a binary value of 0. The processing logic can then insert the write command part of the move command into CAM as another CAM entry, and set the holdtag identifier to a binary value of 1 to indicate that the CAM entry correlating to the write command part of the move command is linked to the CAM entry correlating to the read command part of the move command. The processing logic can further set the tail identifier to 1 for the write portion of the move command, set the tail identifier to 0 of a previous CAM entry of the linked list, and set the next identifier, of the previous CAM entry of the linked list, to the CAM entry ID of the write command part of the move command.

Responsive to determining that the source address and the destination address referenced by the move command does not match an address referenced by one or more of the CAM entries in the CAM, the processing logic proceeds to operation 528. At operation 528, the processing logic generates a new linked list and inserts the move command into the CAM. In particular, the processing logic inserts the read command part of the move command as one CAM entry, and the write command part as another CAM entry. For the read command part of the move command, the processing logic can set the head identifier and the destination head identifier to a value of 1 to indicate that the memory access command is a head memory access command. The processing logic can then issue the memory access command. For the write command part of the move command, the processing logic can set the holdtag identifier to a binary value of 1 to indicate that the CAM entry correlating to the write command part of the move command is linked to the CAM entry correlating to the read command part of the move command.

Figure 6:
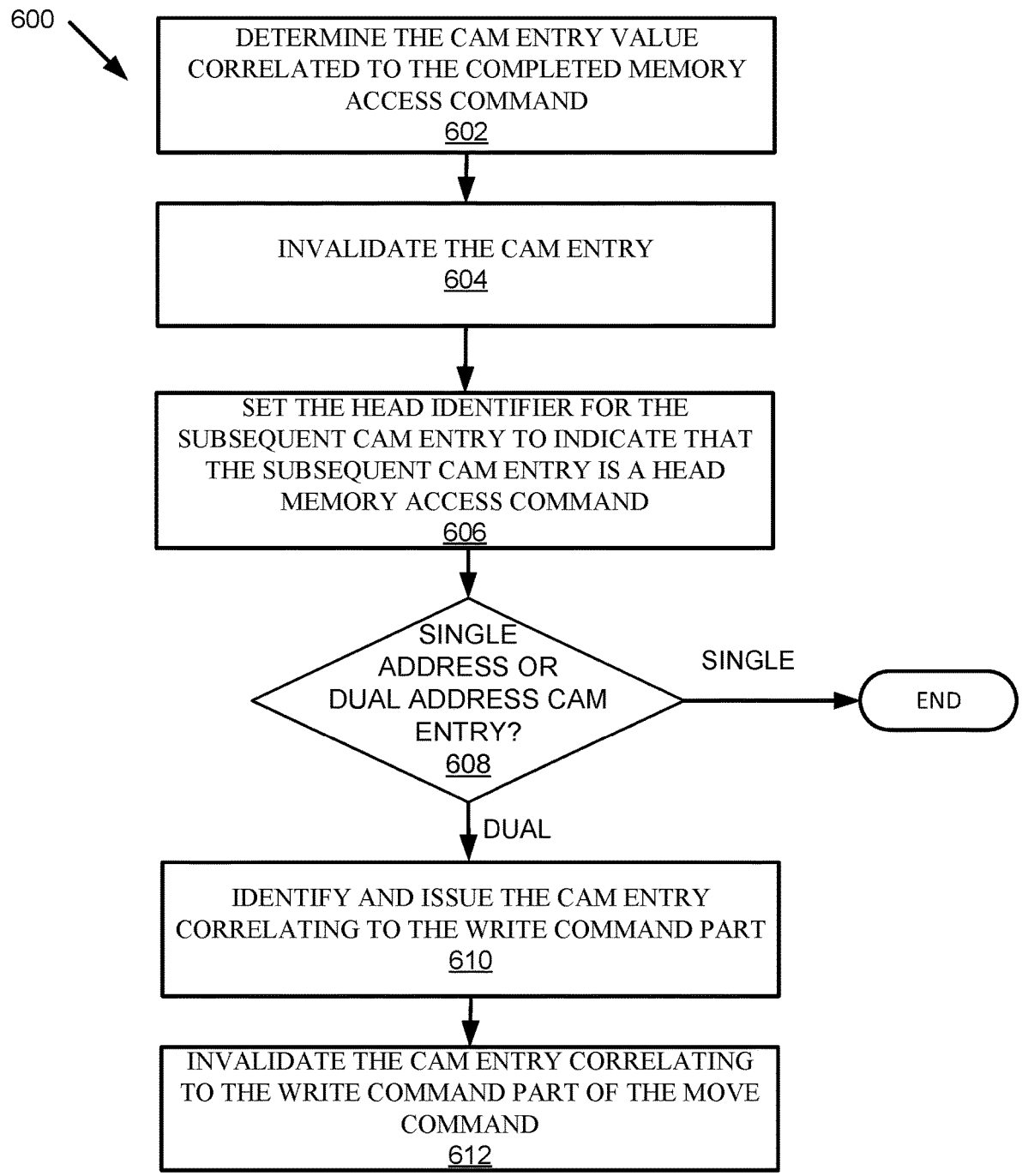
FIG. 6 is a flow diagram of an example method of implementing data consistency management, in accordance with some embodiments of the present disclosure.

FIG. 6 is a flow diagram of an example method 600 of implementing data consistency management, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the DCM component 113 FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 602, responsive to receiving an indication that the memory device completed a memory access command, the processing logic determines the CAM entry value correlated to the completed memory access command. For example, the processing logic can receive read data associated with a read access command, or an indication that write data associated with a write access command was programmed. The processing logic can determine the CAM entry value using metadata, a data structure, an identifier, etc.

At operation 604, the processing logic invalidates the CAM entry (e.g., sets the valid identifier to a binary value of 0) and indicates that the CAM entry is free to receive another memory access command.

At operation 606, responsive to the tail identifier indicating that there is a subsequent CAM entry in the corresponding linked list, the processing logic sets the head identifier for the subsequent CAM entry to indicate that the subsequent CAM entry is a head memory access command (e.g., set the head identifier to a binary value of 1). In some embodiments, responsive to the subsequent CAM entry being indicated as a head memory access command and a destination head memory access command, the memory sub-system controller can issue the subsequent CAM entry.

At operation 608, the processing logic determines whether the CAM entry relates to a single address command or a read command part of a move command. Responsive to the CAM entry relating to a single address command, method 600 ends. Responsive to the CAM entry relating to a read command part of a move command, the processing logic proceeds to operation 610.

At operation 610, the processing logic identifies and issues the CAM entry correlating to the write command part. For example, the processing logic can use the holdtag identifier to identify the CAM entry correlating to the write command part. The processing logic can then issue the write command to the memory device.

At operation 612, responsive to receiving an indication that the memory device completed the write command, the processing logic invalidates the CAM entry correlating to the write command part (e.g., sets the valid identifier to a binary value of 0) and indicates that the CAM entry is free to receive another memory access command. The processing logic can further perform operation 606 responsive to the tail identifier indicating that there is a subsequent CAM entry in the corresponding linked list.

Figure 7:
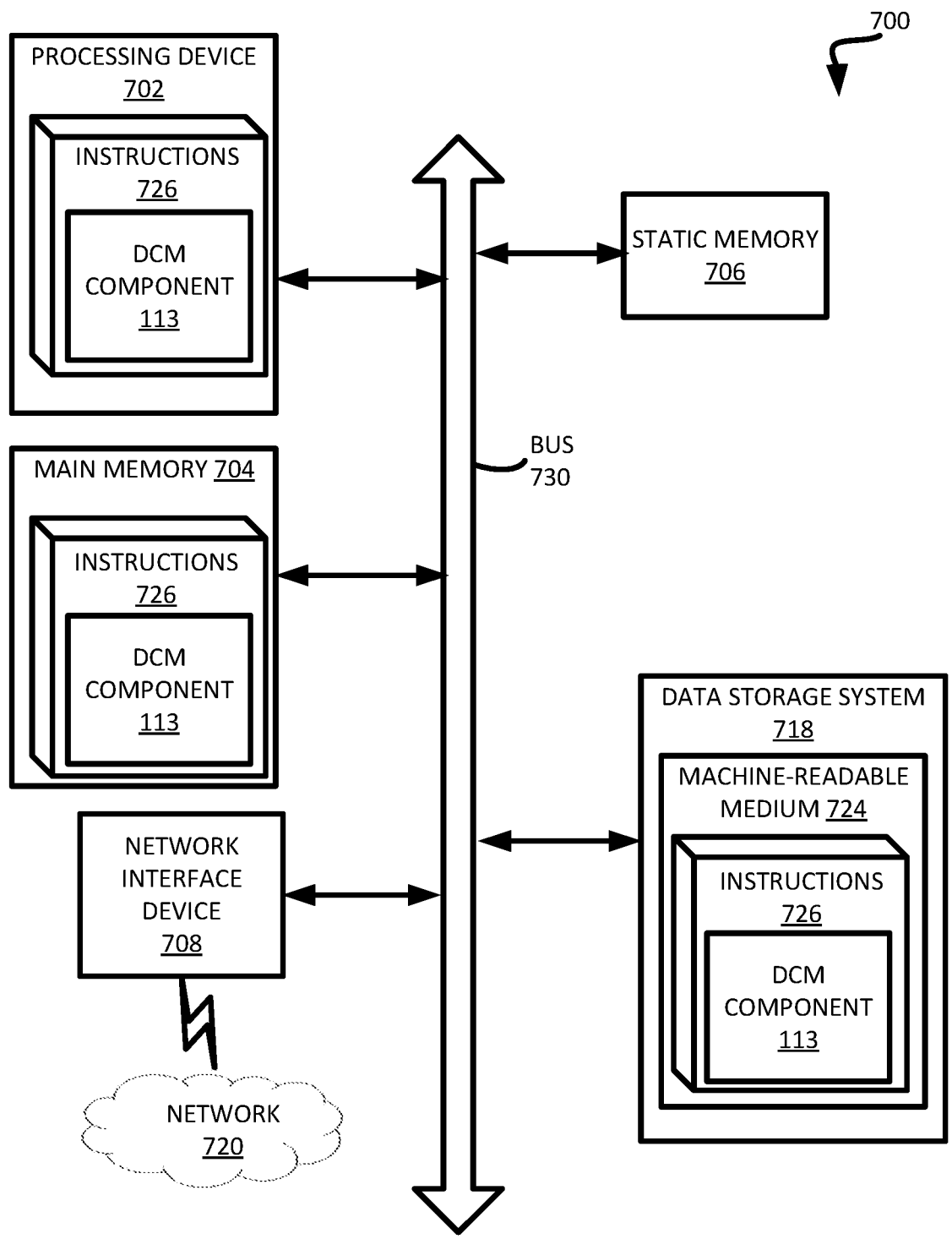
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to DCM component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to DCM component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A system comprising:
   a memory device; and a processing device, operatively coupled with the memory device, to perform operations comprising:
responsive to receiving a memory access command, determining that the memory access command is a dual-address command comprising a source address and a destination address;
generating a first content addressable memory (CAM) entry associated with a read command of the dual-address command, wherein the first CAM entry references the source address;
generating a second CAM entry associated with a write command of the dual-address command, wherein the second CAM entry references the destination address;
inserting the first CAM entry and the second CAM entry into a CAM; and
issuing, to the memory device, the read command associated with the first CAM entry.

2. The system of claim 1, wherein the processing device is to perform operations further comprising:
responsive to determining that a third CAM entry references the source address, appending the first CAM entry to a tail of a corresponding linked list.

3. The system of claim 1, wherein the processing device is to perform operations further comprising:
responsive to determining that a third CAM entry references the destination address, appending the second CAM entry to a tail of a corresponding linked list.

4. The system of claim 1, wherein the first CAM entry comprises an indicator identifying the second CAM entry.

5. The system of claim 4, wherein the processing device is to perform operations further comprising:
receiving an indication that the read command associated with the first CAM entry is complete;
identifying the second CAM entry using the indicator; and
issuing, to the memory device, the write command associated with the second CAM entry.

6. The system of claim 1, wherein the processing device is to perform operations further comprising:
receiving an indication that the read command associated with the first CAM entry is complete; and
invalidating the first CAM entry.

7. The system of claim 1, wherein the processing device is to perform operations further comprising:
responsive to determining that no CAM entries reference the source address or the destination address, generating a new linked list associated with the first CAM entry.

8. A method comprising:
generating a first content addressable memory (CAM) entry referencing a source address of a move command;
generating a second CAM entry associated referencing a destination address of the move command; and
inserting the first CAM entry and the second CAM entry into a CAM.

9. The method of claim 8, further comprising:
responsive to determining that a third CAM entry references the source address, appending the first CAM entry to a tail of a corresponding linked list.

10. The method of claim 8, further comprising:
responsive to determining that a third CAM entry references the destination address, appending the second CAM entry to a tail of a corresponding linked list.

11. The method of claim 8, wherein the first CAM entry comprises an indicator identifying the second CAM entry.

12. The method of claim 11, further comprising:
receiving an indication that a read command associated with the first CAM entry is complete;
identifying the second CAM entry using the indicator; and
issuing, to the memory device, a write command associated with the second CAM entry.

13. The method of claim 8, further comprising:
receiving an indication that a read command associated with the first CAM entry is complete; and
invalidating the first CAM entry.

14. The method of claim 8, further comprising:
responsive to determining that no CAM entries reference the source address or the destination address, generating a new linked list associated with the first CAM entry.

15. A non-transitory machine readable storage medium storing instructions that, when executed by a processing device, cause the processing device to perform operations comprising:
responsive to receiving a memory access command, determining that the memory access command is a dual-address command comprising a source address and a destination address;
generating a first content addressable memory (CAM) entry associated with a read command of the dual-address command, wherein the first CAM entry references the source address;
generating a second CAM entry associated with a write command of the dual-address command, wherein the second CAM entry references the destination address;
inserting the first CAM entry and the second CAM entry into a CAM; and
issuing, to a memory device, the read command associated with the first CAM entry.

16. The non-transitory machine readable storage medium of claim 15, wherein the processing device is to perform operations further comprising:
responsive to determining that a third CAM entry references the source address, appending the first CAM entry to a tail of a corresponding linked list.

17. The non-transitory machine readable storage medium of claim 15, wherein the processing device is to perform operations further comprising:
responsive to determining that a third CAM entry references the destination address, appending the second CAM entry to a tail of a corresponding linked list.

18. The non-transitory machine readable storage medium of claim 15, wherein the first CAM entry comprises an indicator identifying the second CAM entry.

19. The non-transitory machine readable storage medium of claim 18, wherein the processing device is to perform operations further comprising:
receiving an indication that the read command associated with the first CAM entry is complete;
identifying the second CAM entry using the indicator; and
issuing, to the memory device, the write command associated with the second CAM entry.

20. The non-transitory machine readable storage medium of claim 15, wherein the processing device is to perform operations further comprising:
responsive to determining that no CAM entries reference the source address or the destination address, generating a new linked list associated with the first CAM entry.

* * * * *